United States Patent
Ikoma et al.

(10) Patent No.: US 6,310,492 B1
(45) Date of Patent: Oct. 30, 2001

(54) CMOS SEMICONDUCTOR INTEGRATED CIRCUIT

(75) Inventors: Heiji Ikoma, Nara; Yoshitsugu Inagaki, Osaka; Hiroyuki Konishi, Osaka; Koji Oka, Osaka; Akira Matsuzawa, Kyoto, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/561,962

(22) Filed: May 1, 2000

(30) Foreign Application Priority Data

May 6, 1999 (JP) .................................................. 11-125781
Sep. 9, 1999 (JP) .................................................. 11-255248

(51) Int. Cl.[7] ............................................ H03K 19/0175
(52) U.S. Cl. .............................. 326/81; 326/83; 327/534
(58) Field of Search ................................ 326/80, 81, 83, 326/86; 327/534, 535

(56) References Cited

U.S. PATENT DOCUMENTS

| | | |
|---|---|---|
| 5,004,936 | 4/1991 | Andresen . |
| 5,338,978 * | 8/1994 | Larsen et al. ........................ 326/81 |
| 5,341,034 * | 8/1994 | Matthews ............................. 326/80 |
| 5,448,198 * | 9/1995 | Toyoshima et al. ................. 326/81 |
| 5,644,266 | 7/1997 | Chen et al. . |
| 5,844,425 * | 12/1998 | Nguyen et al. ...................... 326/81 |
| 5,926,056 * | 7/1999 | Morris et al. ....................... 326/81 |
| 6,046,627 * | 4/2000 | Itoh et al. ........................... 327/534 |
| 6,103,603 * | 8/2000 | Han .................................... 438/532 |

FOREIGN PATENT DOCUMENTS

| | | |
|---|---|---|
| 09172362 | 6/1997 | (JP) . |
| WO97/32399 | 9/1997 | (WO) . |

OTHER PUBLICATIONS

"The Process Dependence on Positive Bias Temperature Aging Instability of p+ (B) Polysilicon–Gate MOS Devices", H. Ushizaka et al., IEEE Transactions on Electron Devices, vol. 40, No. 5, May 1993, pp. 932–937.

"Long–Term Bias Temperature Reliability of P+ Polysilicon Gated FET Devices", W.W. Abadeer et al., IEEE Transactions on Electron Devices, vol. 42, No. 2, Feb. 1995, pp. 360–362.

* cited by examiner

Primary Examiner—Michael Tokar
Assistant Examiner—Don Phu Le
(74) Attorney, Agent, or Firm—McDermott, Will & Emery

(57) ABSTRACT

In order to reduce power consumption, a power supply for a digital circuit portion is shut off, so that the output voltage of the power supply becomes the zero level. A CMOS (complementary metal oxide semiconductor) inverter has a P-channel FET (field effect transistor) with a gate electrode formed of P-type polysilicon. A source electrode of the P-channel FET is connected to the power supply and a back gate electrode of the P-channel FET is in direct connection with the aforesaid source electrode. The P-channel FET is placed in a state of not functioning as a transistor when the power supply is shut off in a low power consumption mode. However, in order to prevent the P-channel FET from undergoing characteristic degradation in that mode, there is the provision of a pull-down switch capable of fixing, in the mode, the voltage of the gate electrode of the P-channel FET at the zero level.

20 Claims, 13 Drawing Sheets

CM OS SEMICONDUCTOR INTEGRATED CIRCUIT

BACKGROUND OF THE INVENTION

The present invention relates to a semiconductor integrated circuit having a field effect transistor (FET).

Low power consumption in semiconductor integrated circuits has been required. Particularly, for the case of portable equipments that run on batteries, since their battery capacity is limited, there have been strong demands for reducing power consumption in semiconductor integrated circuits for use in such portable equipments.

U.S. Pat. No. 5,644,266 (issued Jul. 1, 1997) and PCT Publication No. WO97/32399 (published Sep. 4, 1997) each disclose a technique capable of causing the back gate electrode voltage of a MOS (metal oxide semiconductor) FET to vary for the purpose of controlling the threshold voltage of the FET. By virtue of these prior art techniques, it is possible to provide fast, low power consuming FETs.

Recently, in the field of CMOS (complementary metal oxide semiconductor)-type semiconductor integrated circuit, with the advance of ultra miniaturization process technology, it has become possible to employ a dual gate process in which P-type polysilicon is used as the gate electrode material for P-channel FETs and N-type polysilicon is used as the gate electrode material for N-channel FETs. P-type polysilicon is, for example, a boron (B) doped polysilicon which exhibits the nature of P-type semiconductor.

H. Ushizaka et al. reported, in their paper entitled "The Process Dependence on Positive Bias Temperature Aging Instability of $p^+(B)$ Polysilicon-Gate MOS Devices", IEEE Transactions on Electron Devices, Vol. 40, No. 5, pp. 932–937, May 1993, that a P-channel FET with a P-type polysilicon gate electrode had undergone serious degradation in electrical characteristic due to the influence of thermal stress at the aging time. When thermal stress is placed onto a P-type polysilicon gate electrode with a positive bias voltage applied thereto, in such a gate electrode the bond of a boron ion ($B^-$) and a hydrogen ion ($H^+$) is disconnected and, as a result, the hydrogen ion having a plus electric charge travels to the interface between a gate dioxide layer ($SiO_2$) and a silicon (Si) substrate due to the influence of an electric field by the bias voltage. Such a mechanism has been considered to cause characteristic degradation, e.g., the drop in the threshold voltage of a P-channel FET. Further, H. Ushizaka et al. reported that the characteristics of the P-channel FET were improved by $N_2$ gas annealing.

W. W. Abadeer et al. confirmed the validity of such $N_2$ gas annealing in their paper entitled "Long-Term Bias Temperature Reliability of P+ Polysilicon FET Devices", IEEE Transactions on Electron Devices, Vol. 42, No. 2, pp. 360–362, February 1995.

Apart from the above, in a semiconductor integrated circuit in which an analog circuit portion and a digital circuit portion are mounted in a mixed fashion, there is a situation allowing the digital circuit portion to stop functioning while letting the analog circuit portion in operation. Under such a condition, if the power supply for the digital circuit portion is shut off to pull the output voltage of the power supply down to the zero level, this will reduce power consumption in the semiconductor integrated circuit to a considerable extent. However, the employment of a dual gate process produces some problems. Suppose, for example, that a source electrode of a P-channel FET in the digital circuit portion is connected to a power supply and that a back gate electrode of the P-channel FET is brought into direct connection with the aforesaid source electrode. In this case, when the power supply is shut off, the voltage of each of the source and back gate electrodes of the P-channel FET becomes the zero level. As a consequence, the P-channel FET enters a state of not functioning as a transistor. If, in such a state, positive voltage is continuously applied to the gate electrode of the P-channel FET from the analog circuit portion, this produces the problem that the P-channel FET undergoes degradation in electrical characteristic owing to the foregoing mechanism, therefore being unable to regain its original electrical characteristics. Even when the foregoing $N_2$ gas annealing is carried out in a step of the semiconductor integrated circuit fabrication, the same problem occurs.

In a differential amplifier, it is possible to achieve a reduction in power consumption by turning off a current source transistor for operating a pair of input transistors. However, when employing a dual gate process, the same problem as mentioned above arises for the reason that it is likely that, in a state in which the voltage of each of the source and back gate electrodes of a P-channel FET forming one of the input transistor pair becomes the zero level, positive Voltage is continuously applied to the gate electrode of the P-channel FET.

SUMMARY OF THE INVENTION

Accordingly, an object of the present invention is to protect a P-channel FET with a gate electrode of P-type semiconductor from degradation by the devising of a circuit configuration, in a semiconductor integrated circuit having a low power consumption mode.

In order to achieve the object, the present invention provides a semiconductor integrated circuit which employs the following configuration. More specifically, the semiconductor integrated circuit of the present invention comprises a P-channel FET which has a drain electrode, a source electrode, a gate electrode formed of a P-type semiconductor material, and a back gate electrode and which is configured such that in a normal operation mode (a) a certain voltage is supplied from a power supply to the source electrode and (b) another voltage representative of an input signal is supplied to the gate electrode, wherein the semiconductor integrated circuit further comprises control means, responsive to a control signal which is asserted when reducing power consumption in the semiconductor integrated circuit, for controlling at least one of the voltage of the gate electrode and the voltage of the back gate electrode so as to prevent the gate electrode voltage from exceeding the back gate electrode voltage, in order to protect the P-channel FET which is being in a state of not functioning as a transistor from degradation. As a result of the adoption of such a configuration, even when an ion of hydrogen having a plus electric charge is generated in the gate electrode due to the influence of thermal stress, the hydrogen ion will remain within the gate electrode, whereby the P-channel FET is prevented from undergoing characteristic degradation.

In accordance with one embodiment of the present invention, in a low power consumption mode in which the back gate electrode voltage of the P-channel FET becomes the ground voltage level (=0 V), the gate electrode voltage of the P-channel FET is fixed at the non-positive voltage level (for example, 0 V) in response to the control signal.

In accordance with another embodiment of the present invention, in response to the control signal, the back gate electrode voltage of the P-channel FET is fixed at a positive voltage not lower than the gate electrode voltage of the P-channel FET. It is to be noted that this embodiment of the present invention differs much from the foregoing prior art techniques (i.e., U.S. Pat. No. 5,644,266 and PCT Publication No. WO97/32399) in that the back gate electrode voltage of the P-channel FET in the state of not functioning as a transistor is subjected to control.

Further, in accordance with still another embodiment of the present invention, in response to the control signal, control is carried out so as not to produce any potential difference between the gate and back gate electrodes of the P-channel FET.

DETAILED DESCRIPTION OF THE INVENTION

Hereinafter, embodiments of the present invention will be described by making reference to FIGS. 1–13. FIGS. 1–5 show examples of the application of the present invention to semiconductor integrated circuits each having a CMOS inverter. FIGS. 6–13, on the other hand, show examples of the application of the present invention to semiconductor integrated circuits each having a CMOS differential amplifier.

The semiconductor integrated circuits of FIGS. 1–5, in each of which an analog circuit portion and a digital circuit portion are mounted in a mixed fashion, are fabricated using a dual gate process and have a normal operation mode and a low power consumption mode. Power supplies for the analog circuit portion are AVDD and AVSS, and in any one of these two modes, AVDD=3.3 V and AVSS=0 V. On the other hand, power supplies for the digital circuit portion are VDD and VSS. In the normal operation mode, VDD=1.8 V and VSS=0 V. In the low power consumption mode, VDD=VSS=0 V. In other words, the high voltage power supply AVDD is a power supply that is not shut off even in the low power consumption mode, while on the other hand the low voltage power supply VDD is a power supply which is shut off in the low power consumption mode and, as a result, whose output voltage becomes the zero level.

Figure 1:
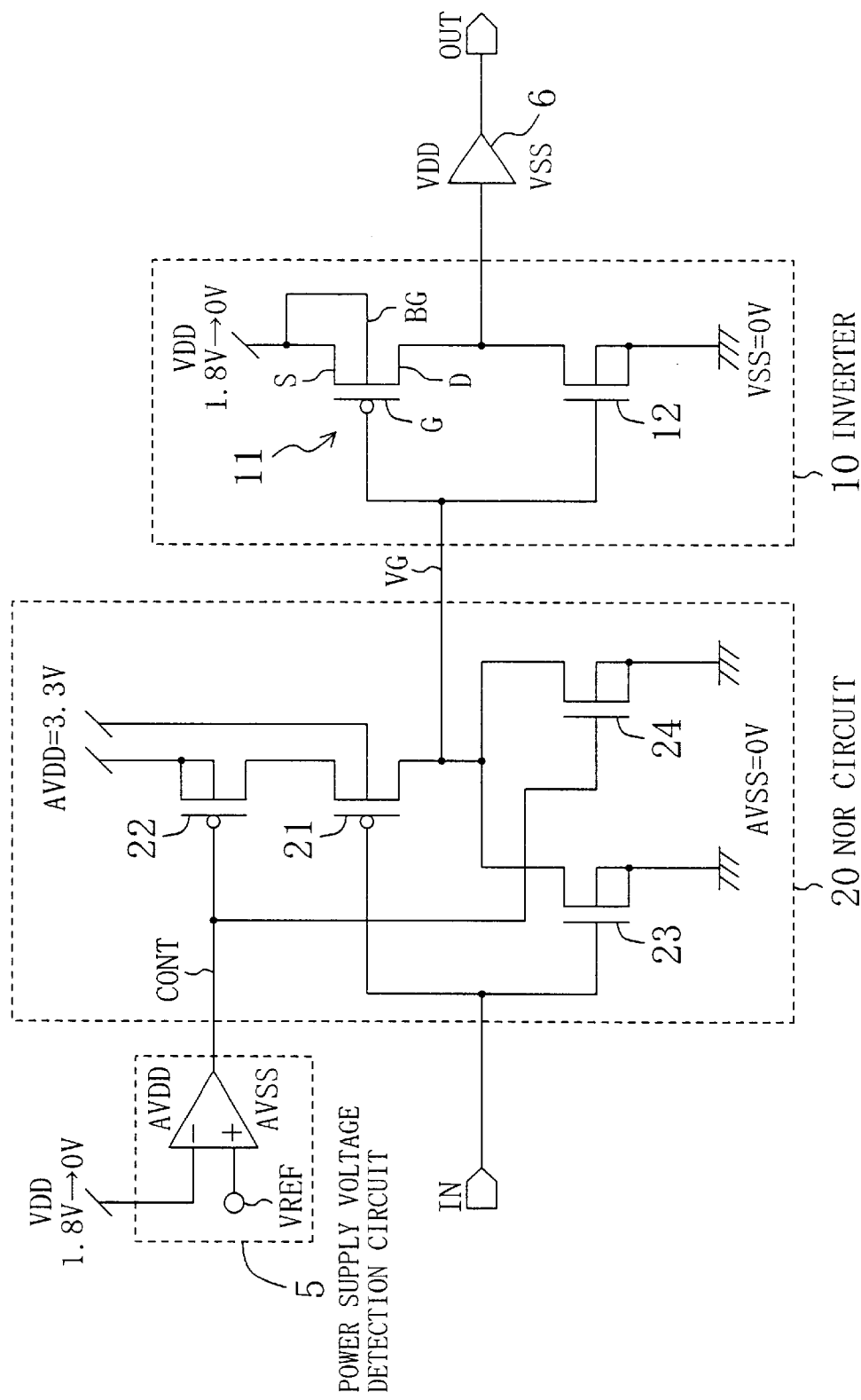
FIG. 1 is a circuit diagram illustrating an example of the configuration of a semiconductor integrated circuit according to the present invention.

The semiconductor integrated circuit of FIG. 1 has a CMOS inverter 10. The CMOS inverter 10 comprises a P-channel FET 11 and an N-channel FET 12. The P-channel FET 11 has a drain electrode D, a source electrode S, a gate electrode G formed of P-type polysilicon, and a back gate electrode BG. The N-channel FET 12 has a drain electrode, a source electrode, a gate electrode formed of N-type polysilicon, and a back gate electrode. The gate electrode G of the P-channel FET 11 and the gate electrode of the N-channel FET 12 are connected together to form an input terminal at which to receive a gate voltage VG. The drain electrode D of the P-channel FET 11 and the drain electrode of the N-channel FET 12 are connected together to form an output terminal at which to provide an output (OUT) signal through a buffer 6. The source electrode S of the P-channel FET 11 is connected to VDD and, in addition, the back gate electrode BG of the P-channel FET 11 is in direct connection with the source electrode S. The source electrode of the N-channel FET 12 is connected to VSS and, in addition, the back gate electrode of the N-channel FET 12 is in direct connection with the aforesaid source electrode. The buffer 6 is connected to VDD as well as to VSS.

The semiconductor integrated circuit of FIG. 1 further has a power supply voltage (PSV) detection circuit 5 and a NOR circuit 20 with two inputs and a single output. The PSV detection circuit 5 is a detection circuit which detects a state (VDD=0 V) in which the power supply of the digital circuit portions 6 and 10 is shut off to assert a control (CONT) signal to its logical "H" level and which is formed of a comparator for the comparison of the power supply voltage VDD with a reference voltage VREF. More specifically, for example, if VDD $\geq$ VREF, then CONT="L" =0 V, and if VDD<VREF, then CONT="H" =3.3 V, where VREF is 0.9 V. One of the two inputs of the NOR circuit 20 is connected to an input (IN) signal and the other input thereof is connected to the CONT signal. The output of the NOR circuit 20 is connected to the gate electrode G of the P-channel FET 11 as well as to the gate electrode of the N-channel FET 12. The NOR circuit 20 is formed of first and second P-channel FETs 21 and 22 and first and second N-channel FETs 23 and 24. Gate electrodes of the first P-channel FET 21 and the first N-channel FET 23 are connected together to form an input terminal at which to receive the IN signal. Gate electrodes of the second P-channel FET 22 and the second N-channel FET 24 are connected together to form an input terminal at which to receive the CONT signal. Drain electrodes of the first P-channel FET 21 and the first and second N-channel FETs 23 and 24 together form an output terminal at which to supply VG to the CMOS inverter 10. A source electrode of the second P-channel FET 22 is connected to AVDD and, in addition, a back gate electrode of the second P-channel FET 22 is in direct connection with the aforesaid source electrode. A source electrode of the first P-channel FET 21 is connected to a drain electrode of the second P-channel FET 22 and a back gate electrode of the first P-channel FET 21 is connected to AVDD. A source electrode of the first N-channel FET 23 is connected to AVSS and, in addition, a back gate electrode of the first N-channel FET 23 is in direct connection with the aforesaid source electrode. A source electrode of the second N-channel FET 24 is connected to AVSS and, in addition, a back gate electrode of the second N-channel FET 24 is in direct connection with the aforesaid source electrode.

In accordance with the semiconductor integrated circuit of FIG. 1, since VDD=1.8 V in the normal operation mode, CONT="L". Accordingly, the second P-channel FET 22 holds its on state and the second N-channel FET 24 holds its off state, at which time the NOR circuit 20 functions as an inverter for supplying to the CMOS inverter 10 the voltage VG of a signal obtained by inversion of the logical level of the IN signal. The "H" level of VG is 3.3 V and the "L" level thereof is 0 V. The CMOS inverter 10 and the buffer 6 provide a signal obtained by inversion of the logical level of VG as the OUT signal. The "H" level of the OUT signal is 1.8 V and the "L" level thereof is 0 V.

In the low power consumption mode of the semiconductor integrated circuit of FIG. 1, since VDD=0 V, both the CMOS inverter 10 and the buffer 6 stop functioning. Such a state is a state in which neither the P-channel FET 11 nor the N-channel FET 12 functions as a transistor. Meanwhile, since VDD=0 V, the PSV detection circuit 5 asserts the CONT signal to the level of "H". As a result, the second P-channel FET 22 holds its off state and the second N-channel FET 24 holds its on state. In other words, the second N-channel FET 24, interposed between the gate electrode G of the P-channel FET 11 and AVSS (=0 V), functions as a switch operable to enter its closed state in response to the CONT signal asserted to the level of "H" and fixes VG at the ground voltage level (=0 V), regardless of the logical level of the IN signal. As a result of such arrangement, even when an ion of hydrogen having a plus electric charge is generated in the gate electrode G of the P-channel FET 11 due to the influence of thermal stress, the hydrogen ion will remain in the gate electrode G, whereby the P-channel FET 11 is prevented from undergoing characteristic degradation.

Figure 2:
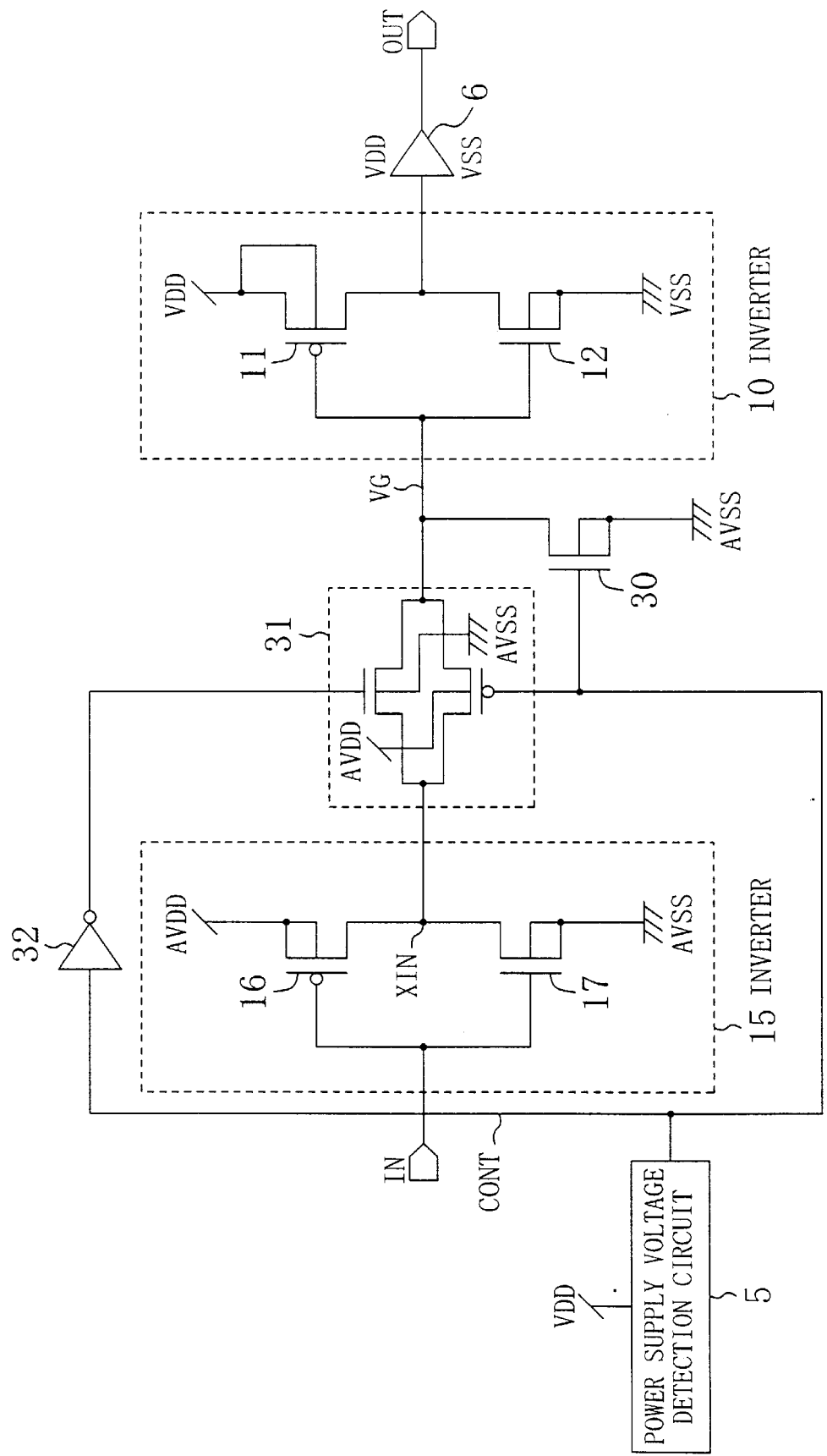
FIG. 2 is a circuit diagram illustrating another example of the configuration of a semiconductor integrated circuit according to the present invention.

In the semiconductor integrated circuit of FIG. 2, the NOR circuit 20 of FIG. 1 is replaced by a CMOS inverter 15, and interposed between the CMOS inverter 15 and the CMOS inverter 10 are a pull-down switch 30 formed of an N-channel FET and a CMOS-structure input switch 31. The CMOS inverter 15 is formed of a P-channel FET 16 and an N-channel FET 17. Gate electrodes of the P-channel FET 16 and the N-channel FET 17 are connected together to form an input terminal at which to receive the IN signal. Drain electrodes of the P-channel FET 16 and the N-channel FET 17 are connected together to form an output terminal at which to supply to the input switch 31 an inverted input (XIN) signal obtained by inversion of the logical level of the IN signal. A source electrode of the P-channel FET 16 is connected to AVDD and a source electrode of the N-channel FET 17 is connected to AVSS. The pull-down switch 30 is interposed between the gate electrode of the P-channel FET 11 in the CMOS inverter 10 and AVSS (=0 V) and enters its closed state in response to the CONT signal asserted to the level of "H" by the PSV detection circuit 5 in the low power consumption mode, whereby VG is fixed at the ground voltage level (=0 V). Being interposed between the XIN signal and VG, the input switch 31 is configured such that it enters its open state in response to he CONT signal asserted to the level of "H". An inverter 32 is disposed to supply to the gate electrode of an N-channel FET which forms a part of the input switch 31 the inverted CONT signal. Also, in the semiconductor integrated circuit of FIG. 2, it is possible to prevent the P-channel FET 11 from undergoing characteristic degradation, as in the case of FIG. 1. Further, in each of the configurations of FIGS. 1 and 2, VG may be fixed at the negative voltage level in the low power consumption mode.

Figure 3:
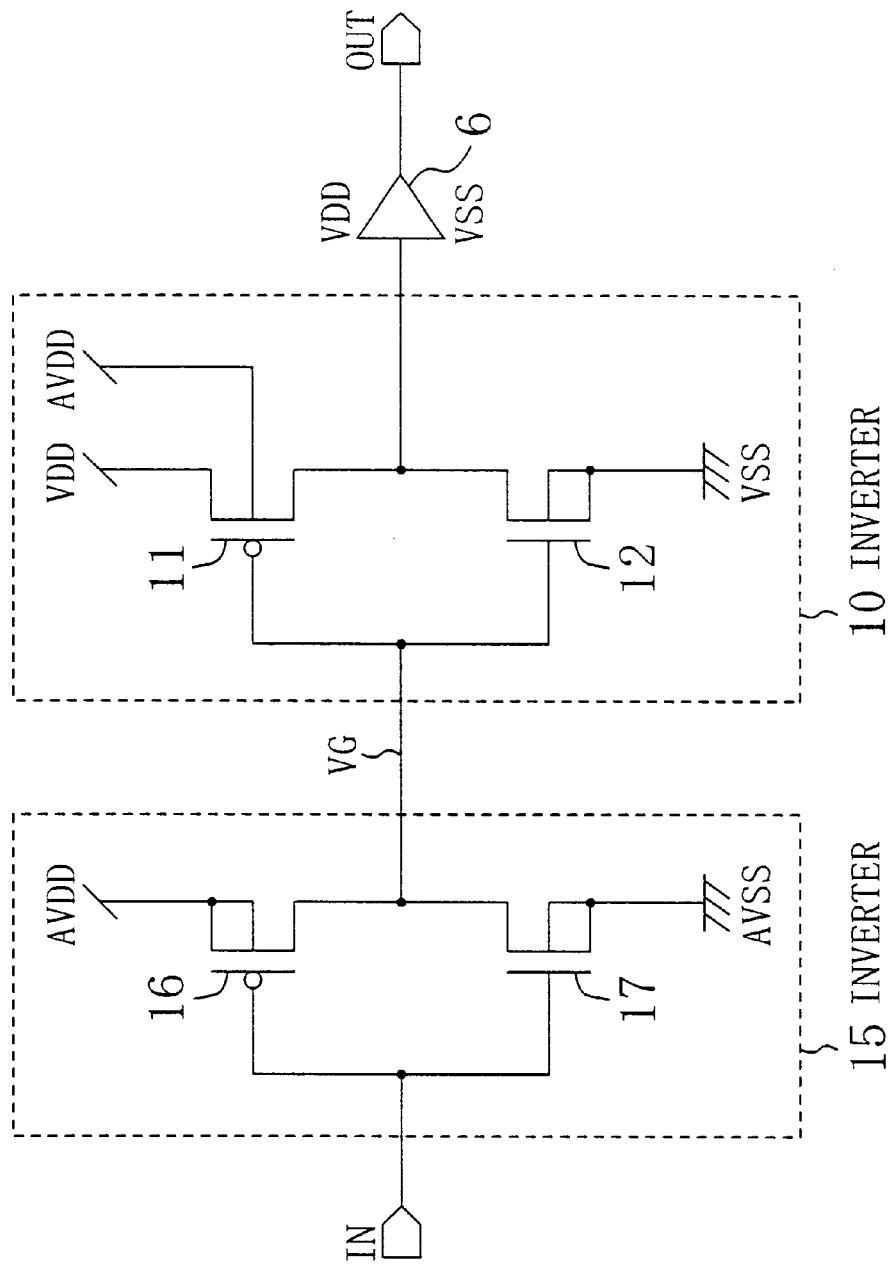
FIGS. 3–13 are circuit diagrams illustrating other examples of the configurations of semiconductor integrated circuits according to the present invention.

In the semiconductor integrated circuit of FIG. 3, the CMOS inverters 15 and 10 are in direct connection with each other, wherein the source electrode of the P-channel FET 11 in the CMOS inverter 10 located at the latter stage is connected to VDD and the back gate electrode thereof is connected to AVDD. Here, the PSV detection circuit 5, the pull-down switch 30, the input switch 31, and the inverter 32 are all unnecessary. In the low power consumption mode of the semiconductor integrated circuit of FIG. 3, although the source electrode voltage of the P-channel FET 11 drops down to 0 V, its back gate electrode voltage is fixed at AVDD (=3.3 V). On the other hand, the gate electrode voltage VG of the P-channel FET 11 varies because the CMOS inverter 15 operates not only in the normal operation mode but also in the low power consumption mode. The "H" level of VG is 3.3 V and the "L" level thereof is 0 V. In other words, the back gate electrode voltage of the P-channel FET 11 will never fall below the gate electrode voltage VG of the P-channel FET 11. Accordingly, also in the semiconductor integrated circuit of FIG. 3, it is possible to prevent the P-channel FET 11 from undergoing characteristic degradation. Further, the configuration of FIG. 3 is effective when the difference between AVDD and VDD in the normal operation mode is small.

Figure 4:
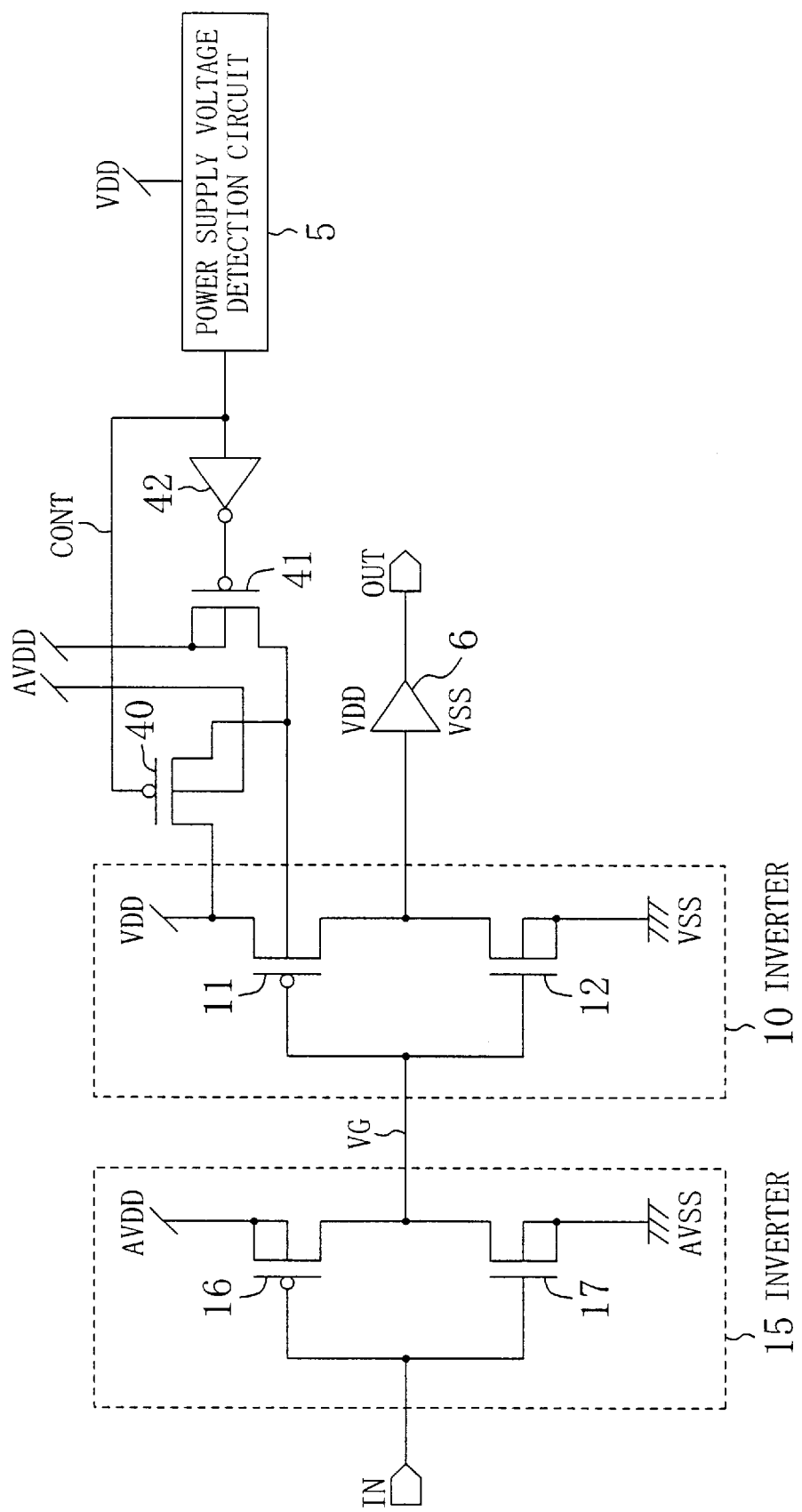

In the semiconductor integrated circuit of FIG. 4, a cutout switch 40 is interposed between the back gate and source electrodes of the P-channel FET 11 of FIG. 3 and a pull-up switch 41 is interposed between the back gate electrode of the P-channel FET 11 and AVDD. These switches 40 and 41 each are formed of a P-channel FET and their respective back gate electrodes are connected to AVDD. The cutout switch 40 enters its open state in response to the CONT signal asserted to the level of "H" by the PSV detection circuit 5 in the low power consumption mode. The pull-up switch 41 is configured such that it enters its closed state in response to the CONT signal asserted to the level of "H". An inverter 42 is disposed to supply the inverted CONT signal to the gate electrode of a P-channel FET forming the pull-up switch 41. Also, in the semiconductor integrated circuit of FIG. 4, the P-channel FET 11 is prevented from undergoing characteristic degradation because the back gate electrode voltage of the P-channel FET 11 is fixed at AVDD (=3.3 V) in the low power consumption mode.

Figure 5:
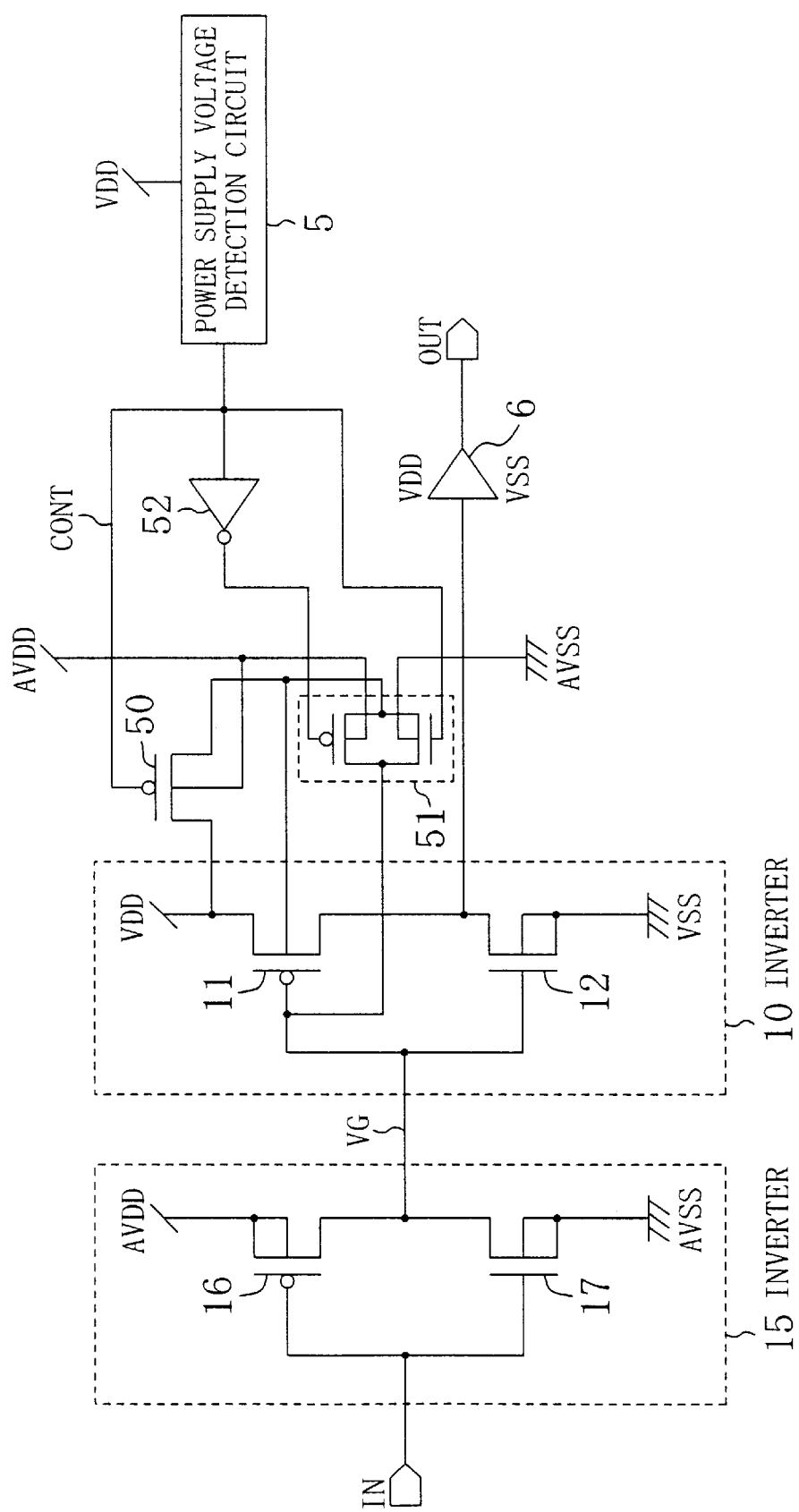

In the semiconductor integrated circuit of FIG. 5, there is established no connection between the back gate electrode of the P-channel FET 11 and AVDD, a cutout switch 50 is interposed between the back gate and source electrodes of the P-channel FET 11, and an equalize switch 51 is interposed between the gate and back gate electrodes of the P-channel FET 11. The cutout switch 50 is formed of a P-channel FET and the equalize switch 51 has a CMOS structure. The cutout switch 50 enters its open state in response to the CONT signal asserted to the level of "H" by the PSV detection circuit 5 in the low power consumption mode. The equalize switch 51 is configured such that it enters its closed state in response to the CONT signal asserted to the level of "H". An inverter 52 is disposed to supply to the gate electrode of a P-channel FET forming a part of the equalize switch 51 the inverted CONT signal. In the semiconductor integrated circuit of FIG. 5, it is arranged such that control is carried out in order not to create any potential difference between the gate and back gate electrodes of the P-channel FET 11 in the low power consumption mode, whereby the P-channel FET 11 is prevented from undergoing characteristic degradation.

Further, the PSV detection circuit 5 is not necessarily formed of the aforesaid comparator. Alternatively, the PSV detection circuit 5 may be formed of other circuit means such as an inverter or the like. An arrangement may be made, in which the CONT signal is applied from outside the semiconductor integrated circuit.

Each of the semiconductor integrated circuits of FIGS. 6–13 is fabricated using a dual gate process and has both a normal operation mode and a low power consumption mode. The power supplies are AVDD and AVSS, regardless of "specified"or not in the drawings, and in any one of these two modes, AVDD=3.3 V and AVSS=0 V. In other words, AVDD is a power supply that is not shut off even in the low power consumption mode. Here, suppose that a control (XCONT) signal is asserted to the level of "L" in the low power consumption mode. In the normal operation mode, on the one hand, XCONT="H" =3.3 V. In the low power consumption mode, on the other hand, XCONT="L" =0 V.

Figure 6:
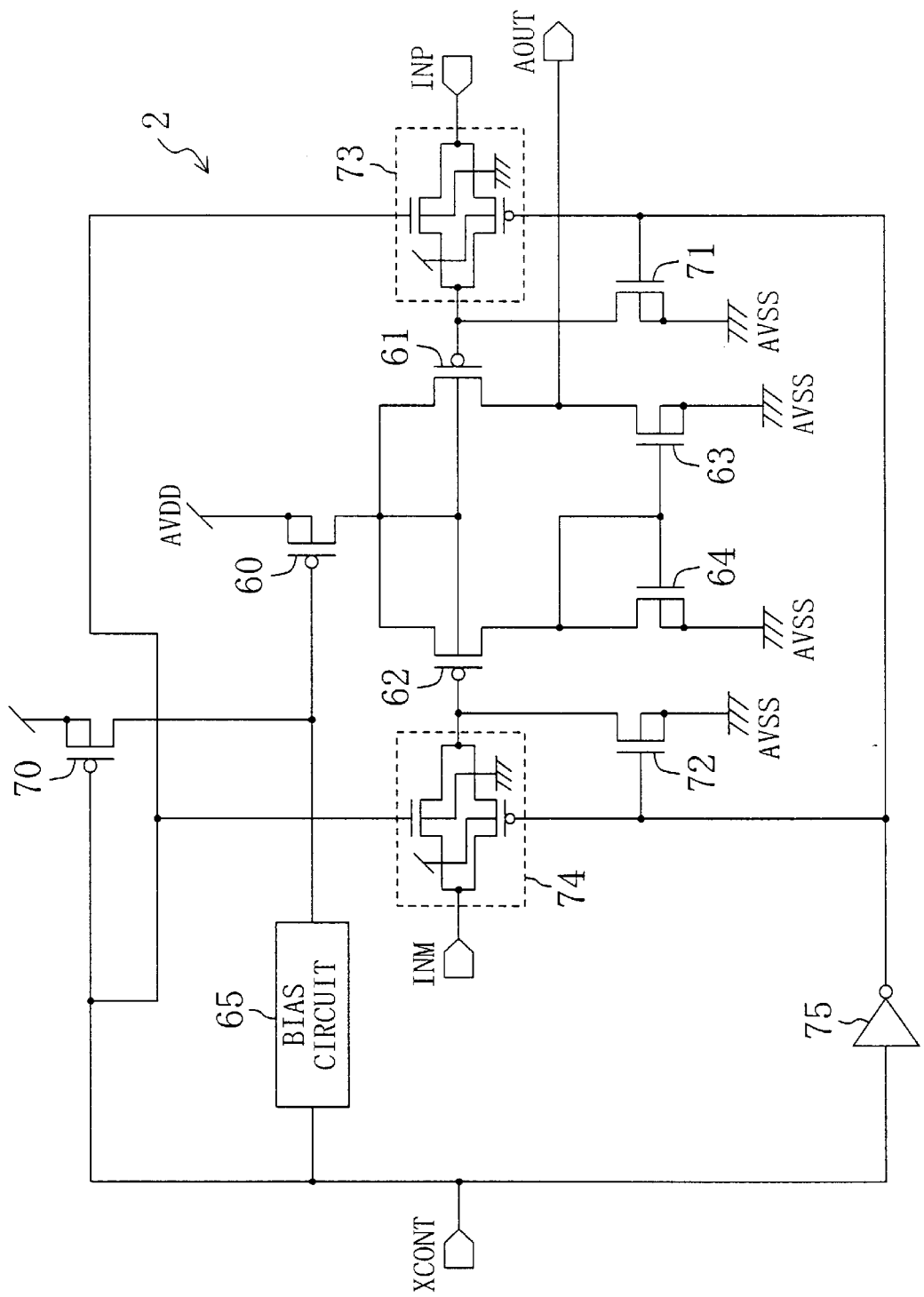

The semiconductor integrated circuit of FIG. 6 is provided with a CMOS differential amplifier 2. The CMOS differential amplifier 2 is basically constructed of first to third P-channel FETs 60–62 and first and second N-channel FETs 63 and 64. The three P-channel FETs 60–62 each have a drain electrode, a source electrode, a gate electrode of P-type polysilicon, and a back gate electrode. The two N-channel FETs 63 and 64 each have a drain electrode, a source electrode, a gate electrode of N-type polysilicon, and a back gate electrode. The first P-channel FET 60 functions as a current source transistor in the normal operation mode and as a power down switch in the low power consumption mode, its source and back gate electrodes being in connection with AVDD. The second and third P-channel FETs 61 and 62 constitute a pair of differential input transistors. The second P-channel FET 61 is an input transistor disposed to receive at its gate electrode a positive input (INP) signal, while the third P-channel FET 62 is an input transistor disposed to receive at its gate electrode a negative input (INM) signal. Source and back gate electrodes of the second P-channel FET 61 and source and back gate electrodes of the third P-channel FET 62 are connected together directly and, in addition, these electrodes are further connected to a drain electrode of the first P-channel FET 60. The first and second N-channel FETs 63 and 64 constitute a current mirror circuit. Gate electrodes of these first and second N-channel FETs 63 and 64 are connected together and, in addition, these electrodes are connected to a drain electrode of the second N-channel FET 64 as well as to a drain electrode of the third P-channel FET 62. Drain electrodes of the second P-channel FET 61 and the first N-channel FET 63 are connected together to form an output terminal at which to supply an output (AOUT) signal. A source electrode of the first N-channel FET 63 is connected to AVSS and, in addition, a back gate electrode of the first N-channel FET 63 is in direct connection with the aforesaid source electrode. Likewise, a source electrode of the second N-channel FET 64 is connected to AVSS and, in addition, a back gate electrode of the second N-channel FET 64 is in direct connection with the aforesaid source electrode.

The CMOS differential amplifier 2 of FIG. 6 further includes a bias circuit 65, a mode control switch 70, pull-down switches 71 and 72, input switches 73 and 74, and an inverter 75. The bias circuit 65 is disposed to apply an adequate bias voltage to the gate electrode of the first P-channel FET 60 which functions as a current source transistor in the normal operation mode. The mode control switch 70, formed of a P-channel FET, enters its closed state in response to the XCONT signal asserted to the level of "L" in the low power consumption mode, thereby pulling up the gate electrode voltage of the first P-channel FET 60 so as to cause the first P-channel FET 60 to turn off. In this case, the first P-channel FET 60, interposed between the source electrode of each of the second and third P-channel FETs 61 and 62 and AVDD, enters its open state in response to the XCONT signal asserted to the level of "L", thereby functioning as a power down switch for reducing power consumption in the CMOS differential amplifier 2. The pull-down switch 71, constructed of an N-channel FET interposed between the gate electrode of the second P-channel FET 61 and AVSS (=0 V), enters its closed state in response to the XCONT signal asserted to the level of "L" in the low power consumption mode, thereby fixing the gate electrode voltage of the second P-channel FET 61 at the ground voltage level (=0 V). The other pull-down switch 72, constructed of an N-channel FET interposed between the gate electrode of the third P-channel FET 62 and AVSS (=0 V), enters its closed state in response to the XCONT signal asserted to the level of "L", thereby fixing the gate electrode voltage of the third P-channel FET 62 at the ground voltage level (=0 V). The input switch 73, being interposed between the INP signal and the gate electrode of the second P-channel FET 61, is CMOS configured so as to enter its open state in response to the XCONT signal asserted to the level of "L". The other input switch 74, being interposed between the INM signal and the gate electrode of the third P-channel FET 62, is CMOS configured so as to enter its open state in response to the XCONT signal asserted to the level of "L". The inverter 75 is disposed to generate from the XCONT signal its inverted signal for the on/off control of the switches 71–74.

In accordance with the semiconductor integrated circuit of FIG. 6, since XCONT="H" in the normal operation mode, the mode control switch 70 and the pull-down switches 71 and 72 are all in their open state and both the input switches 73 and 74 are in their closed state. At this time, the first P-channel FET 60 functions, upon receipt of a bias voltage supplied from the bias circuit 65, as a current source transistor for operating the second and third P-channel FETs 61 and 62. This accordingly enables the CMOS differential amplifier 2, formed of the second and third P-channel FETs 61 and 62 and the first and second N-channel FETs 63 and 64, to provide the AOUT signal according to the potential difference between the INP signal and the INM signal.

In the low power consumption mode of the semiconductor integrated circuit of FIG. 6, the mode control switch 70 enters its closed state in response to the XCONT signal asserted to the level of "L", as a result of which the first P-channel FET (as a current source transistor/power-down switch) 60 turns off to cause the CMOS differential amplifier 2 to stop functioning. This state is a state in which neither the second P-channel FET 61 nor the third P-channel FET 62 functions as a transistor.

Suppose here that, even in the low power consumption mode in which the first P-channel FET 60 turns off, the pull-down switches 71 and 72 still remain in their open state and the input switches 73 and 74 still remain in their closed state. Moreover, suppose that the voltage level of the INP signal is fixed at AVDD (=3.3 V) and that the voltage level of the INM signal is fixed at AVSS (=0 V). In this situation, the voltage of each of the source and back gate electrodes of the second P-channel FET 61 is pulled down to AVSS (=0 V) through the third P-channel FET 62 and the second N-channel FET 64. Meanwhile, the INP signal at a positive voltage level (=3.3 V) is continuously applied to the gate electrode of the second P-channel FET 61. This accordingly produces the problem that the electrical characteristics of the second P-channel FET 61 will degrade due to the foregoing mechanism and will not have returned to its original electrical characteristics. In the case the INM signal is fixed at a positive voltage level, the problem of the characteristic degradation of the third P-channel FET 62 will arise.

However, in the low power consumption mode of the semiconductor integrated circuit of FIG. 6, in response to the XCONT signal asserted to the level of "L", the pull-down switches 71 and 72 enter their closed state and, at the same time, the input switches 73 and 74 enter their open state. Accordingly, the voltage of each of the gate electrodes of the second and third P-channel FETs 61 and 62 is fixed at the ground voltage level (=0 V), regardless of the voltage level of the INP and INM signals, as a result of which the second and third P-channel FETs 61 and 62 are prevented from undergoing characteristic degradation. Further, an arrangement may be made, in which the gate electrode voltage of each of the second and third P-channel FETs 61 and 62 is fixed at a negative voltage level in the low power consumption mode.

Figure 7:
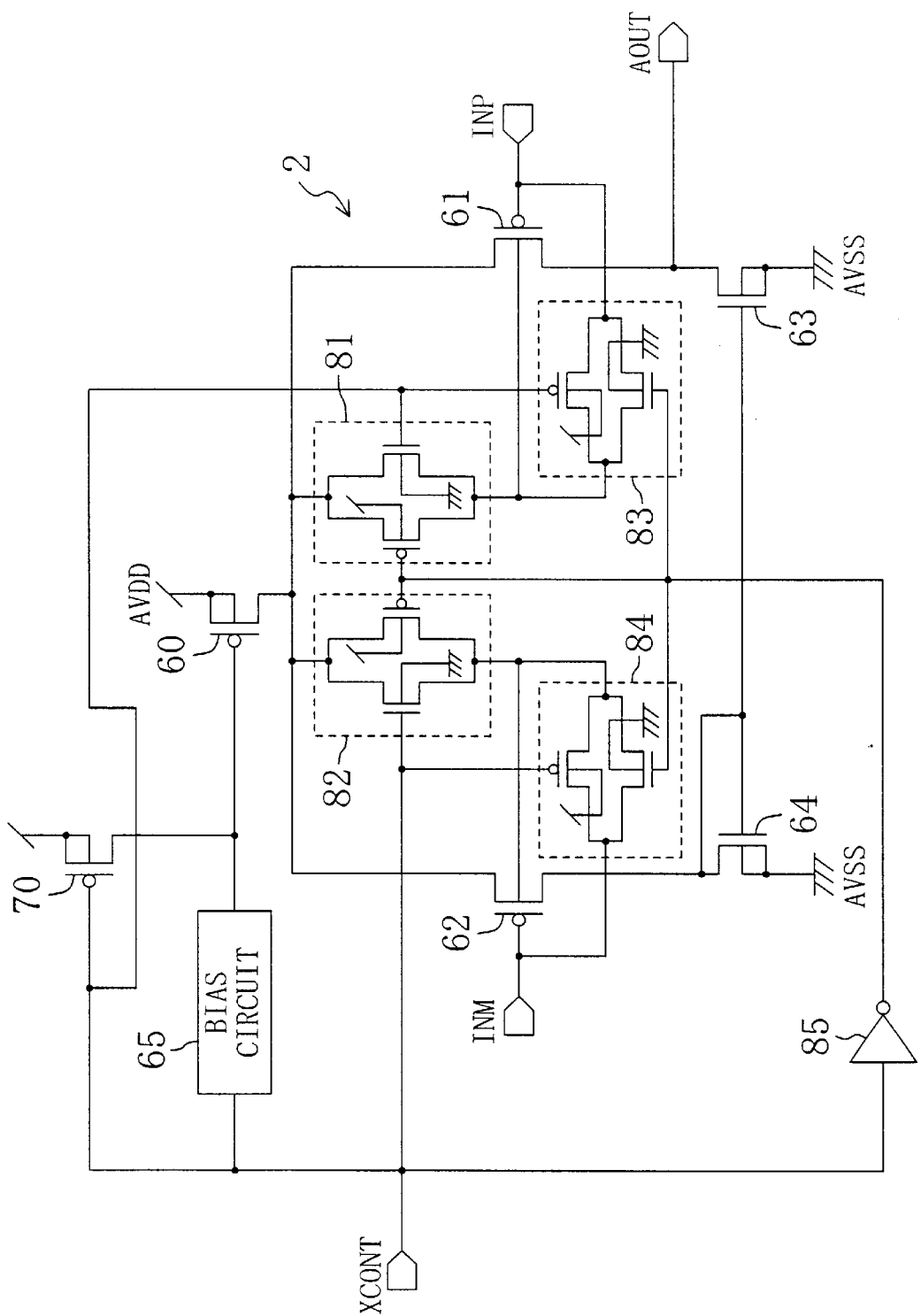

In the semiconductor integrated circuit of FIG. 7, cutout switches 81 and 82 and equalize switches 83 and 84 are provided in place of the pull-down switches 71 and 72 and the input switches 73 and 74 shown in FIG. 6. The cutout switch 81 is a CMOS switch interposed between the back gate and source electrodes of the second P-channel FET 61, while the other cutout switch 82 is a CMOS switch interposed between the back gate and source electrodes of the third P-channel FET 62. Both of these two cutout switches 81 and 82 enter their open state in response to the XCONT signal asserted to the level of "L" in the low power consumption mode. The equalize switch 83 is a CMOS switch interposed between the gate and back gate electrodes of the second P-channel FET 61, while the other equalize switch 84 is a CMOS switch interposed between the gate and back gate electrodes of the third P-channel FET 62. Both of these two equalize switches 83 and 84 enter their closed state in response to the XCONT signal asserted to the level of "L". An inverter 85 is disposed to generate from the XCONT signal its inverted signal for the on/off control of the switches 81–84. In the semiconductor integrated circuit of FIG. 7, control is performed such that there is produced no difference in potential between the gate and back gate electrodes of each of the second and third P-channel FETs 61 and 62 in the low power consumption mode in which the first P-channel FET 60 turns off, thereby making it possible to prevent the second and third P-channel FETs 61 and 62 from undergoing characteristic degradation.

Figure 8:
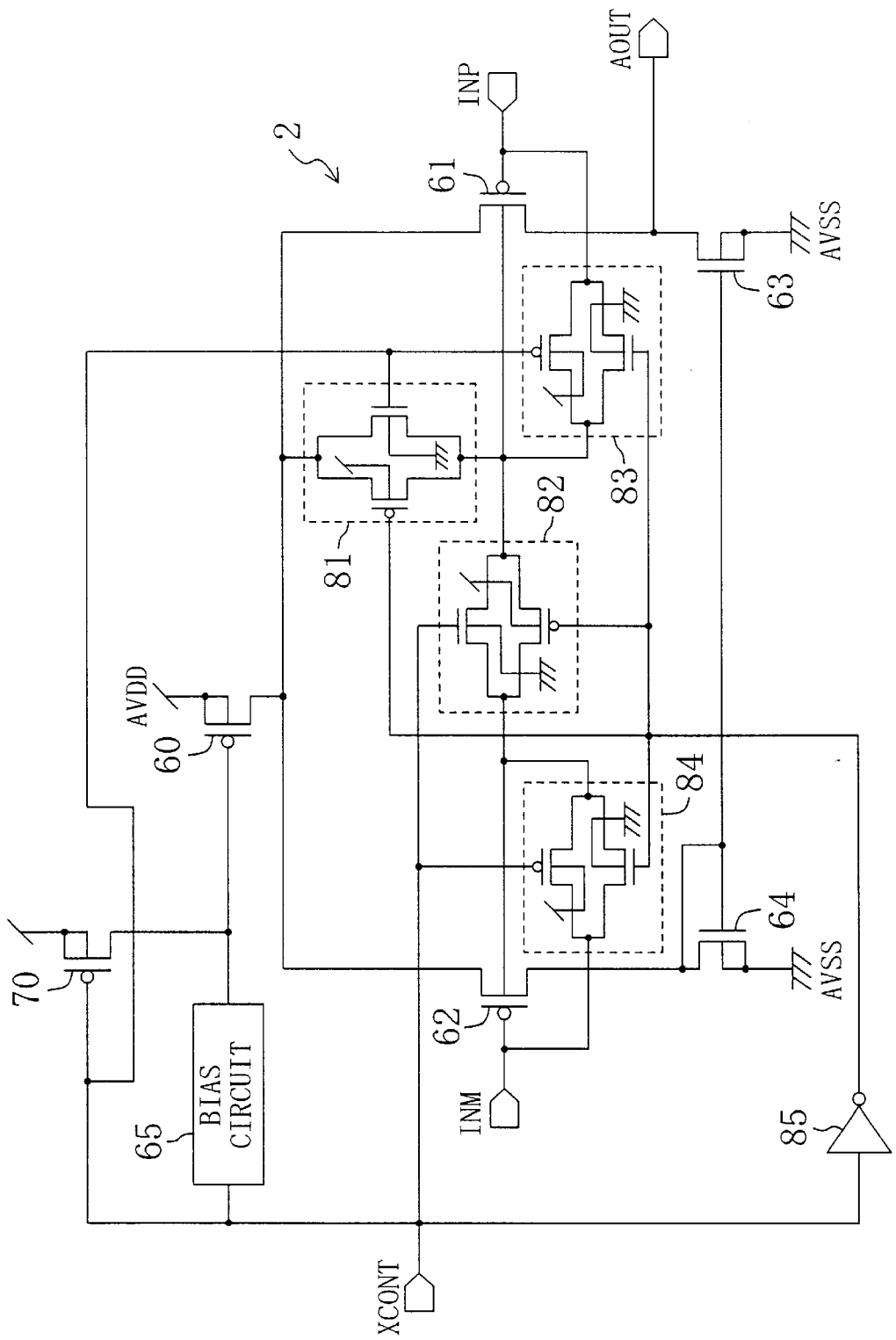

In the semiconductor integrated circuit of FIG. 8, there is made a change in the position of the cutout switch 82 of FIG. 7. In other words, referring to FIG. 8, the cutout switch 82 is shown to be interposed between the back gate electrode of the second P-channel FET 61 and the back gate electrode of the third P-channel FET 62.

Also, in the semiconductor integrated circuit of FIG. 8, it is possible to prevent the second and third P-channel FETs 61 and 62 from undergoing characteristic degradation, as in the case of FIG. 7.

Figure 9:
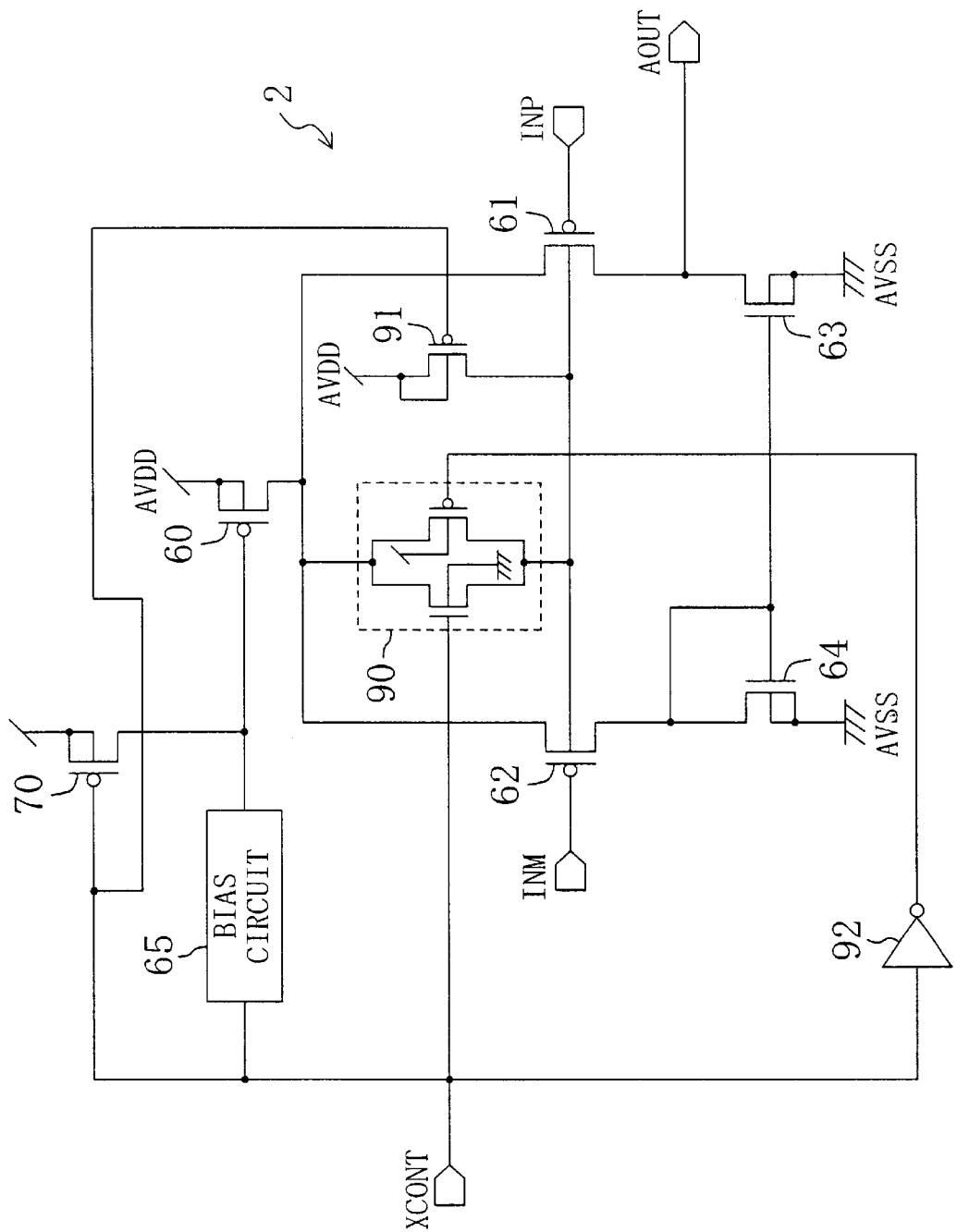

In the semiconductor integrated circuit of FIG. 9, a cutout switch 90 and a pull-up switch 91 are provided in place of the pull-down switches 71 and 72 and the input switches 73 and 74 shown in FIG. 6. The cutout switch 90 is a CMOS-structure switch interposed between a connection node (hereinafter referred to as the first node) of the back gate electrode of the second P-channel FET 61 and the back gate electrode of the third P-channel FET 62 and a connection node (hereinafter referred to as the second node) of the drain electrode of the first P-channel FET 60, the source electrode of the second P-channel FET 61, and the source electrode of the third P-channel FET 62. The cutout switch 90 enters it open state in response to the XCONT signal asserted to the 20 level of "L" in the low power consumption mode. The pull-up switch 91 is formed of a P-channel FET interposed between the first node and AVDD (=3.3 V), being configured so as to enter its closed state in response to the XCONT signal asserted to the level of "L". An inverter 92 is provided to generate from the XCONT signal its inverted signal for the on/off control of the cutout switch 90. Also, in the semiconductor integrated circuit of FIG. 9, since the back gate electrode voltage of each of the second and third P-channel FETs 61 and 62 is fixed at AVDD (=3.3 V) in the low power consumption mode, this makes it possible to prevent these second and third P-channel FETs 61 and 62 from undergoing characteristic degradation.

The configuration of FIG. 9 provides the convenience of chip layout, because by virtue of such a configuration the second and third P-channel FETs 61 and 62 of large size can be disposed in close proximity to each other and a plurality of FETs of small size forming the cutout switch 90 and the pull-up switch 91 can be disposed in the vicinity of the second and third P-channel FETs 61 and 62.

Figure 10:
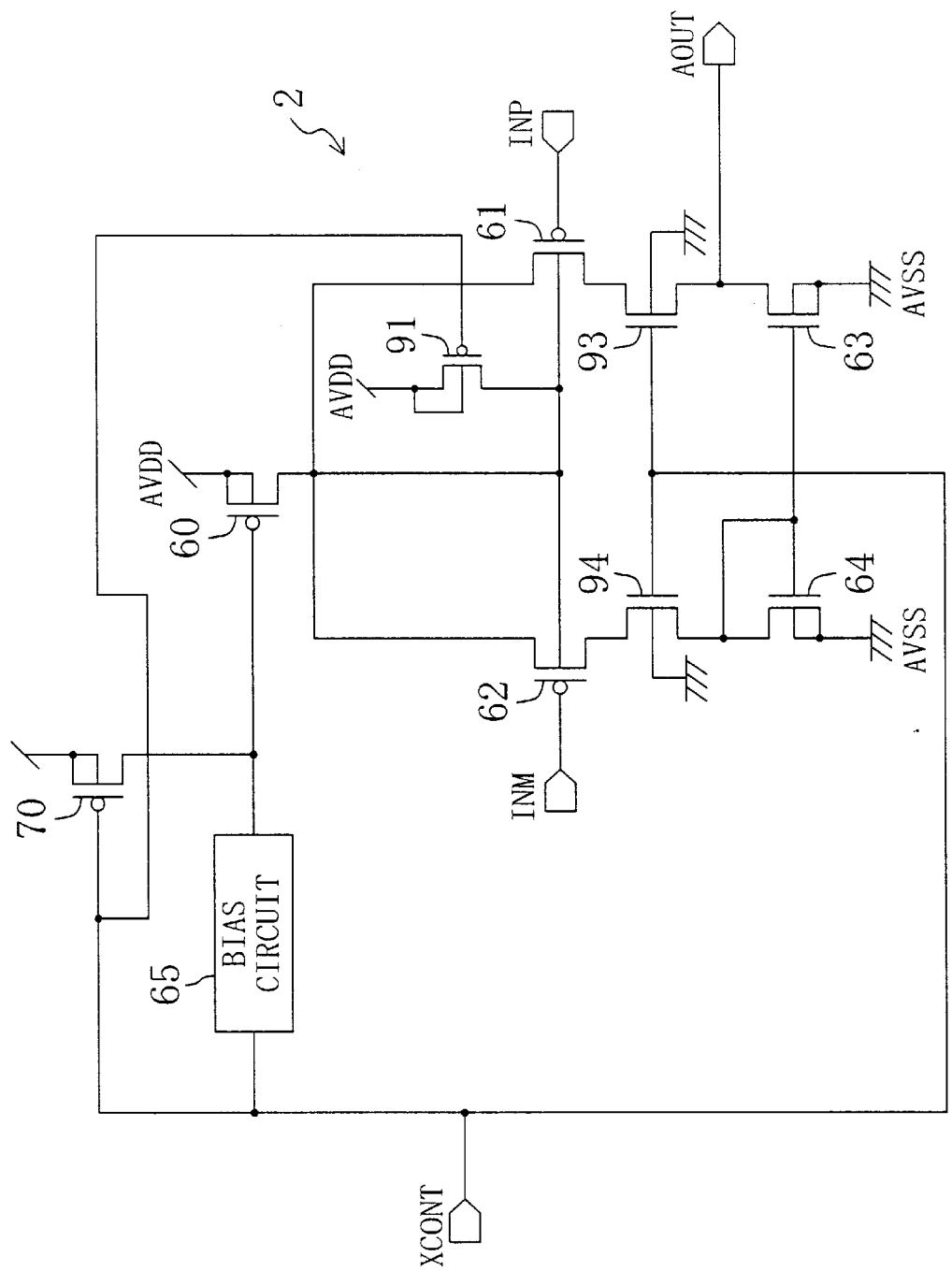

In the semiconductor integrated circuit of FIG. 10, the first and second nodes are in direct connection with each other and current cut switches 93 and 94 are provided in place of the cutout switch 90. The current cut switch 93 is formed of an N-channel FET interposed between the drain electrode of the second P-channel FET 61 and the drain electrode of the first N-channel FET 63. The current cut switch 93 enters its open state in response to the XCONT signal asserted to the level of "L" in the low power consumption mode. The other current cut switch 94 is formed of an N-channel FET interposed between the drain electrode of the third P-channel FET 62 and the drain electrode of the second N-channel FET 64. The current cut switch 94 enters its open state in response to the XCONT signal asserted to the level of "L". In accordance with the semiconductor integrated circuit of FIG. 10, since XCONT="H" in the normal operation mode, both of the mode control switch 70 and the pull-up switch 91 enter their open state, while both the current cut switches 93 and 94 enter their closed state. At this time, the CMOS differential amplifier 2 formed of the second and third P-channel FETs 61 and 62 and the first and second N-channel FETs 63 and 64 is able to provide the AOUT signal according to the potential difference between the INP signal and the INM signal.

In the low power consumption mode of the semiconductor integrated circuit of FIG. 10, the mode control switch 70 enters its closed state in response to the XCONT signal asserted to the level of "L", as a result of which the first P-channel FET (as the current source transistor/power-down switch) 60 turns off to cause the CMOS differential amplifier 2 to stop functioning. This state is a state in which neither the second P-channel FET 61 nor the third P-channel FET 62 functions as a transistor. Meanwhile, the pull-up switch 91 enters its closed state, whereby the voltage of each of the back gate and source electrodes of the second P-channel FET 61 and the voltage of each of the back gate and source electrodes of the third P-channel FET 62 (i.e., the voltage of the first node and the voltage of the second node) are pulled up to AVDD (=3.3 V). However, if the current cut switches 93 and 94 still remain in their closed state, then drain currents flow through the second and third P-channel FETs 61 and 62, as a result of which the voltage of each of the first and second nodes will have been pulled down. To cope with this, in the semiconductor integrated circuit of FIG. 10 it is configured such that the current cut switches 93 and 94 are placed in the open state in response to the XCONT signal asserted to the level of "L" so as to cut off these drain currents. As a result, also in the semiconductor integrated circuit of FIG. 10, the back gate electrode voltage of each of the second and third P-channel FETs 61 and 62 is fixed at AVDD (=3.3 V) in the low power consumption mode, whereby these second and third P-channel FETs 61 and 62 are prevented from undergoing characteristic degradation.

Figure 11:
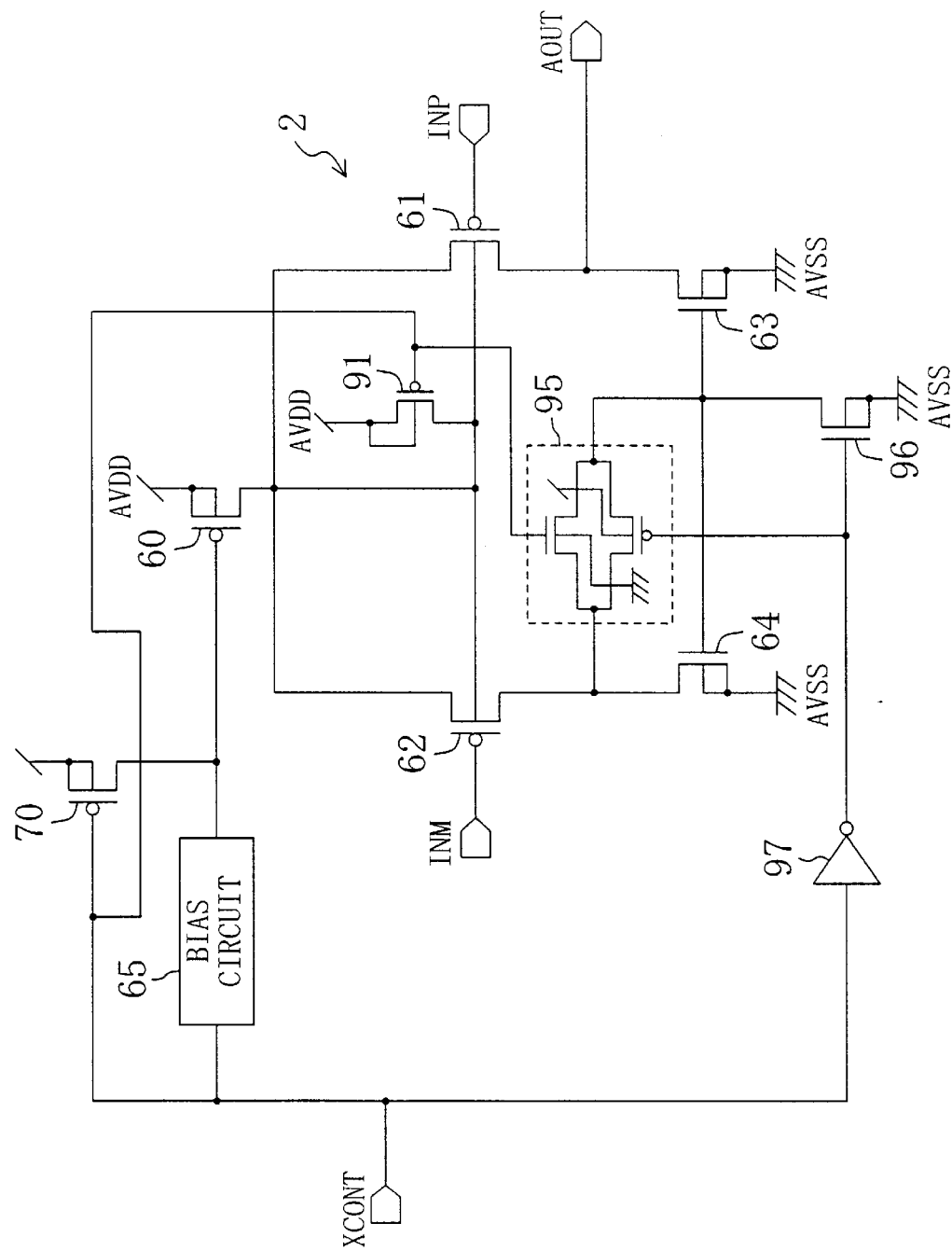

In the semiconductor integrated circuit of FIG. 11, a single current cut switch 95 and a single mode control switch 96 for the off control of the first and second N-channel FETs 63 and 64 are provided in place of the two current cut switches 93 and 94 shown in FIG. 10. The current cut switch 95, formed of a CMOS-structure switch interposed on a connection path between the drain and gate electrodes of the second N-channel FET 64, enters its open state in response to the XCONT signal asserted to the level of "L" in the low power consumption mode. The mode control switch 96 is formed of an N-channel FET and enters its closed state in response to the XCONT signal asserted to the level of "L", whereby the gate electrode voltage of each of the first and second N-channel FETs 63 and 64 is pulled down to AVSS (=0 V) so as to cause both the first and second N-channel FETs 63 and 64 to turn off. The first and second N-channel FETs 63 and 64 in this case function as a current cut switch for disconnecting drain currents going to flow into the second and third P-channel FETs 61 and 62. An inverter 97 is disposed to generate from the XCONT signal its inverted signal for the on/off control of the current cut switch 95 and the mode control switch 96. Also, in the semiconductor integrated circuit of FIG. 11, since the back gate electrode voltage of each of the second and third P-channel FETs 61 and 62 is fixed at AVDD (=3.3 V) in the low power consumption mode, these second and third P-channel FETs 61 and 62 are prevented from undergoing characteristic degradation.

Figure 12:
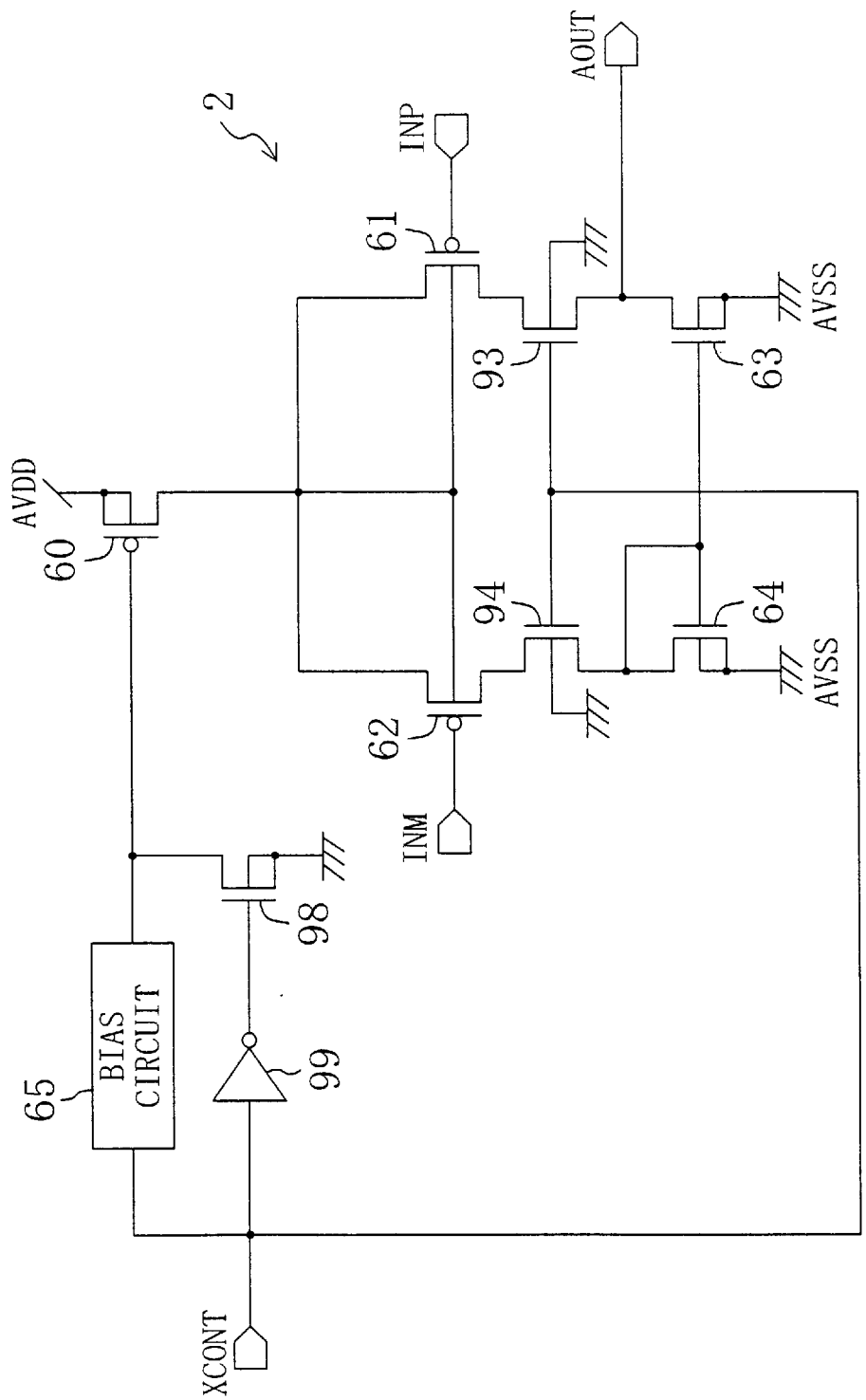

In the semiconductor integrated circuit of FIG. 12, the function of the pull-up switch 91 shown in FIG. 10 is taken over by the first P-channel FET 60 and the power-down function of the first P-channel FET 60 is taken over by the current cut switches 93 and 94. It is to be noted that the first P-channel FET 60 functions as a current source transistor in the normal operation mode. In the semiconductor integrated circuit of FIG. 12, control is executed such that the first P-channel FET 60 conducts in response to the XCONT signal asserted to the level of "L" in the low power consumption mode, for which a mode control switch 98 and an inverter 99 are provided. The mode control switch 98 is formed of an N-channel FET and enters its closed state in response to the XCONT signal asserted to the level of "L", whereby the gate electrode voltage of the first P-channel FET 60 is pulled down to AVSS (=0 V) so as to cause the first P-channel FET 60 to conduct completely. The first P-channel FET 60 in this case functions as a pull-up switch for fixing the voltage of each of the source and back gate electrodes of the second P-channel FET 61 in direct connection with each other and the voltage of each of the source and back gate electrodes of the third P-channel FET 62 in direct connection with each other, at AVDD (=3.3 V). Meanwhile, the current cut switches 93 and 94 which enter their open state in response to the XCONT signal asserted to the level of "L" function as a power-down switch for reducing power consumption in the CMOS differential amplifier 2. Also, in the semiconductor integrated circuit of FIG. 12, since the back gate electrode voltage of each of the second and third P-channel FETs 61 and 62 is fixed at AVDD (=3.3 V) in the low power consumption mode, these second and third P-channel FETs 61 and 62 are prevented from undergoing characteristic degradation.

Figure 13:
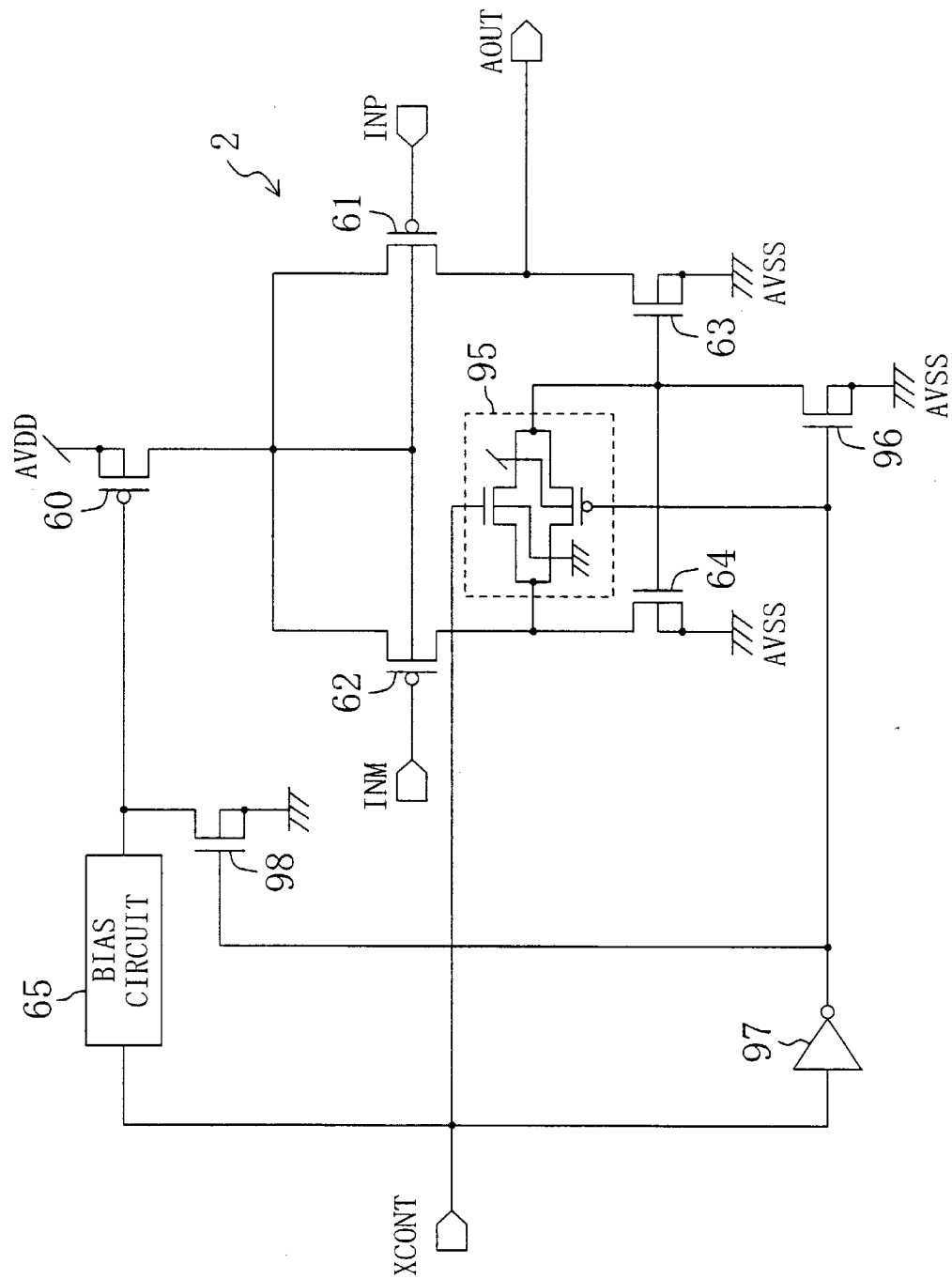

In the semiconductor integrated circuit of FIG. 13, the function of the pull-up switch 91 shown in FIG. 11 is taken over by the first P-channel FET 60 and the power-down function of the first P-channel FET 60 is taken over by the current cut switch 95 and the first and second N-channel FETs 63 and 64. It is to be noted that the first P-channel FET 60 functions as a current source transistor in the normal operation mode. In the semiconductor integrated circuit of FIG. 13, control is executed such that the first P-channel FET 60 conducts in response to the XCONT signal asserted to the level of "L" in the low power consumption mode, for which the mode control switch 98 is provided. The mode control switch 98 is formed of an N-channel FET and enters its closed state in response to the XCONT signal asserted to the level of "L", whereby the gate electrode voltage of the first P-channel FET 60 is pulled down to AVSS (=0 V) so as to cause the first P-channel FET 60 to conduct completely. The first P-channel FET 60 in this case functions as a pull-up switch for fixing the voltage of each of the source and back gate electrodes of the second P-channel FET 61 in direct connection with each other and the voltage of each of the source and back gate electrodes of the third P-channel FET 62 in direct connection with each other, at AVDD (=3.3 V). Meanwhile, the current cut switch 95 which enters its open state in response to the XCONT signal asserted to the level of "L" and the first and second N-channel FETs 63 and 64 which turn off in response to the XCONT signal asserted to the level of "L" function as a power-down switch for reducing power consumption in the CMOS differential amplifier 2. It is to be noted that the first and second N-channel FETs 63 and 64 function as a current mirror circuit in the normal operation mode. Also, in the semiconductor integrated circuit of FIG. 13, since the back gate electrode voltage of each of the second and third P-channel FETs 61 and 62 is fixed at AVDD (=3.3 V) in the low power consumption mode, these second and third P-channel FETs 61 and 62 are prevented from undergoing characteristic degradation.

Further, it is to be noted that the present invention is applicable to semiconductor integrated circuits with functions different from those of the foregoing embodiments as long as they have a low power consumption mode and is provided with a P-channel FET whose gate electrode is formed of a P-type semiconductor material.

What is claimed is:

1. A semiconductor integrated circuit comprising a P-channel field effect transistor (FET) which has a drain electrode, a source electrode, a gate electrode formed of a P-type semiconductor material, and a back gate electrode and which is configured such that in a normal operation mode (a) a certain voltage is supplied from a power supply to said source electrode and (b) another voltage representative of an input signal is supplied to said gate electrode, said semiconductor integrated circuit further comprising:
control means, responsive to a control signal which is asserted when reducing power consumption in said semiconductor integrated circuit, for controlling at least one of the voltage of said gate electrode and the voltage of said back gate electrode so as to prevent said gate electrode voltage from exceeding said back gate electrode voltage, in order to protect said P-channel FET which is being in a state of not functioning as a transistor from degradation.

2. The semiconductor integrated circuit according to claim 1, wherein said gate electrode of said P-channel FET is formed of P-type polysilicon.

3. The semiconductor integrated circuit according to claim 1, wherein said P-channel FET is a transistor which forms a part of a CMOS inverter.

4. The semiconductor integrated circuit according to claim 1, wherein said P-channel FET is a transistor which forms one of a pair of input transistors in a differential amplifier.

5. The semiconductor integrated circuit according to claim 1, wherein said power supply is a power supply which is shut off when reducing power consumption in said semiconductor integrated circuit and whose output voltage then becomes the zero level.

6. The semiconductor integrated circuit according to claim further comprising a detection circuit operable to detect a state in which said power supply is shut off for asserting said control signal.

7. The semiconductor integrated circuit according to claim 1, wherein said power supply is a power supply which is not shut off even when reducing power consumption in said semiconductor integrated circuit; and wherein said semiconductor integrated circuit further comprises a switch which is interposed between said source electrode of said P-channel FET and said power supply and which is configured so as to enter its open state in response to said asserted control signal.

8. The semiconductor integrated circuit according to claim 1, wherein said control means has fixing means for fixing said gate electrode voltage of said P-channel FET at a non-positive voltage.

9. The semiconductor integrated circuit according to claim 8, wherein said back gate electrode of said P-channel FET is an electrode which is in direct connection with said source electrode of said P-channel FET.

10. The semiconductor integrated circuit according to claim 8, wherein said fixing means has a switch which is interposed between said gate electrode of said P-channel FET and said non-positive voltage and which is configured so as to enter its closed state in response to said asserted control signal.

11. The semiconductor integrated circuit according to claim 10, wherein said fixing means further has a switch which is interposed between said input signal and said gate electrode of said P-channel FET and which is configured so as to enter its open state in response to said asserted control signal.

12. The semiconductor integrated circuit according to claim 8, wherein said fixing means has a NOR circuit with two inputs and a single output; and wherein one of said two inputs of said NOR circuit is connected to said input signal, the other of said two inputs of said NOR circuit is connected to said control signal, and said output of said NOR circuit is connected to said gate electrode of said P-channel FET.

13. The semiconductor integrated circuit according to claim 1, wherein said control means has fixing means for fixing said back gate electrode voltage of said P-channel FET at a positive voltage not lower than said gate electrode voltage of said P-channel FET.

14. The semiconductor integrated circuit according to claim 13, said fixing means having:

a switch which is interposed between said back gate and source electrodes of said P-channel FET and which is configured so as to enter its open state in response to said asserted control signal; and a switch which is interposed between said back gate electrode of said P-channel FET and said positive voltage and which is configured so as to enter its closed state in response to said asserted control signal.

15. The semiconductor integrated circuit according to claim 13, wherein said back gate electrode of said P-channel FET is an electrode which is in direct connection with said source electrode of said P-channel FET; and wherein said fixing means has:

a switch which is interposed between said source electrode of said P-channel FET and said power supply and which is configured so as to enter its open state in response to said asserted control signal; and a switch which is interposed between said back gate electrode of said P-channel FET and said positive voltage and which is configured so as to enter its closed state in response to said asserted control signal.

16. The semiconductor integrated circuit according to claim 15 further comprising a switch which is connected to said drain electrode of said P-channel FET and which is configured so as to enter its open state in response to said asserted control signal.

17. The semiconductor integrated circuit according to claim 13, wherein said back gate electrode of said P-channel FET is an electrode in direct connection with said source electrode of said P-channel FET; and wherein said fixing means has a transistor which is interposed between said source electrode of said P-channel FET and said power supply and which is configured so as to conduct in response to said asserted control signal.

18. The semiconductor integrated circuit according to claim 17 further comprising a switch which is connected to said drain electrode of said P-channel FET and which is configured so as to enter its open state in response to said asserted control signal.

19. The semiconductor integrated circuit according to claim 1, wherein said control means has equalize means for equalizing said back gate electrode voltage of said P-channel FET with said gate electrode voltage of said P-channel FET.

20. The semiconductor integrated circuit according to claim 19, said equalize means having:

a switch which is interposed between said back gate and source electrodes of said P-channel FET and which is configured so as to enter its open state in response to said asserted control signal; and a switch which is interposed between said gate and back gate electrodes of said P-channel FET and which is configured so as to enter its closed state in response to said asserted control signal.

* * * * *